(12) United States Patent
Villalon

(10) Patent No.: US 11,199,151 B2
(45) Date of Patent: Dec. 14, 2021

(54) VEHICLE CONTROLLER WITH COMPLEMENTARY CAPACITANCE FOR ANALOG-TO-DIGITAL CONVERTER (A/D) LOW PASS FILTER

(71) Applicant: Cummins Inc., Columbus, IN (US)

(72) Inventor: Jose Gonzalo Villalon, Columbus, IN (US)

(73) Assignee: Cummins Inc., Columbus, IN (US)

( * ) Notice: Subject to any disclaimer, the term of this patent is extended or adjusted under 35 U.S.C. 154(b) by 0 days.

(21) Appl. No.: 16/912,090

(22) Filed: Jun. 25, 2020

(65) Prior Publication Data

US 2020/0412338 A1    Dec. 31, 2020

Related U.S. Application Data

(60) Provisional application No. 62/867,059, filed on Jun. 26, 2019.

(51) Int. Cl.
| | |
|---|---|
| *F02D 41/28* | (2006.01) |
| *H03H 11/04* | (2006.01) |
| *H03M 1/12* | (2006.01) |
| *F02D 41/14* | (2006.01) |

(52) U.S. Cl.
CPC ...... *F02D 41/28* (2013.01); *F02D 2041/1432* (2013.01); *F02D 2041/281* (2013.01); *F02D 2041/286* (2013.01); *H03H 11/04* (2013.01); *H03M 1/12* (2013.01)

(58) Field of Classification Search
CPC .............................................. F02D 2041/281
See application file for complete search history.

(56) References Cited

U.S. PATENT DOCUMENTS

| | | | | |
|---|---|---|---|---|
| 3,731,526 A | * | 5/1973 | Games | ................. H03H 11/126 73/660 |
| 4,716,759 A | * | 1/1988 | Tanaka | .................... G01L 23/08 73/114.16 |
| 5,005,142 A | * | 4/1991 | Lipchak | .............. G06F 11/0709 376/245 |

(Continued)

*Primary Examiner* — Kevin R Steckbauer
(74) *Attorney, Agent, or Firm* — Foley & Lardner LLP

(57) ABSTRACT

An engine control module comprises an input terminal configured to receive an input signal, an analog-to-digital converter configured to receive the input signal from the input terminal, control circuitry configured to receive the input signal from the analog-to-digital converter and to control at least one engine output based on the input signal, and an adjustable low-pass filter. The adjustable low-pass filter is coupled between the input terminal and the analog-to-digital converter such that the analog-to-digital converter receives the input signal from the input terminal via the adjustable low-pass filter. The adjustable low-pass filter is configured to filter the input signal from the input terminal prior to the input signal being applied to the analog-to-digital converter. The adjustable low-pass filter has a first setting in which the adjustable low-pass filter has a first cut-off frequency and a second setting in which the adjustable low-pass filter has a second cut-off frequency, wherein the first setting configures the engine control module to be used with a first sensor having a first dynamic range and the second setting configures the engine control module to be used with a second sensor having a second dynamic range.

20 Claims, 7 Drawing Sheets

(56) References Cited

U.S. PATENT DOCUMENTS

| | | | | |
|---|---|---|---|---|
| 5,076,098 A * | 12/1991 | Miwa | ................ | G01M 15/08 |
| | | | | 73/114.17 |
| 5,545,988 A * | 8/1996 | Sakai | ................ | G11B 5/012 |
| | | | | 324/212 |
| 5,623,913 A * | 4/1997 | Kitajima | ............... | F02D 41/008 |
| | | | | 123/673 |
| 5,805,937 A * | 9/1998 | Kitagawa | ................ | G03B 5/00 |
| | | | | 396/52 |
| 6,529,805 B2 | 3/2003 | Aldrich et al. | | |
| 6,607,492 B2 * | 8/2003 | Ogura | ................... | A61B 5/022 |
| | | | | 600/485 |
| 7,302,314 B2 | 11/2007 | Sommer | | |
| 7,347,081 B2 * | 3/2008 | Inoue | ................ | G01L 23/225 |
| | | | | 73/35.09 |
| 7,825,786 B2 * | 11/2010 | Nishioka | .............. | B60G 17/015 |
| | | | | 340/441 |
| 8,259,431 B2 | 9/2012 | Katta | | |
| 8,427,793 B2 | 4/2013 | Yonezawa et al. | | |
| 9,080,896 B2 * | 7/2015 | Wallrafen | .......... | G01D 5/24476 |
| 9,541,523 B2 * | 1/2017 | Higuchi | ................ | G01N 27/417 |
| 9,650,996 B2 * | 5/2017 | Smith | ................ | B64G 1/60 |
| 9,740,254 B2 | 8/2017 | Itou et al. | | |
| 9,797,331 B2 * | 10/2017 | Sasaki | ................. | F02D 35/028 |
| 9,983,240 B2 * | 5/2018 | Roberts | ............. | G01R 19/0007 |
| 10,033,319 B2 * | 7/2018 | da Silva | ................ | G05B 13/02 |
| 10,048,654 B2 * | 8/2018 | Kosaka | ................. | B25J 9/1633 |
| 10,202,917 B1 * | 2/2019 | Hellstrom | .......... | F02D 41/0087 |
| 10,288,526 B2 * | 5/2019 | Akimoto | ............ | F02D 41/1486 |
| 10,309,345 B2 * | 6/2019 | Smith | .................... | F02K 9/566 |
| 10,562,566 B2 * | 2/2020 | Kim | .................... | B62D 5/0472 |
| 10,566,925 B2 * | 2/2020 | Suzuki | ................... | H02M 1/32 |
| 10,613,148 B2 * | 4/2020 | Izawa | ............... | G01R 31/3835 |
| 2002/0143260 A1 * | 10/2002 | Ogura | .................... | A61B 5/022 |
| | | | | 600/500 |
| 2003/0048759 A1 | 3/2003 | Cara | | |
| 2004/0267493 A1 * | 12/2004 | Pinard | ...................... | G01P 3/44 |
| | | | | 702/145 |
| 2005/0241369 A1 * | 11/2005 | Inoue | .................... | G01L 23/225 |
| | | | | 73/35.09 |
| 2007/0198149 A1 * | 8/2007 | Nishioka | .............. | B60G 17/018 |
| | | | | 701/36 |
| 2012/0176070 A1 * | 7/2012 | Wallrafen | .......... | G01D 5/24461 |
| | | | | 318/400.04 |
| 2014/0290337 A1 * | 10/2014 | Higuchi | ............... | G01N 27/417 |
| | | | | 73/31.05 |
| 2016/0265477 A1 * | 9/2016 | Smith | .................... | B64G 1/402 |
| 2016/0341772 A1 * | 11/2016 | Roberts | ................ | G01R 35/005 |
| 2017/0030283 A1 * | 2/2017 | Sasaki | ................ | F02D 41/2438 |
| 2017/0138781 A1 * | 5/2017 | Adibhatla | ............... | F02C 7/232 |
| 2017/0248101 A1 * | 8/2017 | Smith | .................... | B64G 1/402 |
| 2017/0276694 A1 * | 9/2017 | Uehara | .................... | H03H 7/06 |
| 2017/0307477 A1 * | 10/2017 | Akimoto | ................ | F02D 41/28 |
| 2018/0181083 A1 * | 6/2018 | Kosaka | .................... | B25J 9/1633 |
| 2018/0340954 A1 * | 11/2018 | Ishino | ....................... | G01P 3/02 |
| 2019/0002022 A1 * | 1/2019 | Kim | ...................... | B62D 6/02 |
| 2019/0149083 A1 * | 5/2019 | Suzuki | .................... | H02P 29/68 |
| | | | | 318/400.08 |
| 2019/0154439 A1 * | 5/2019 | Binder | ..................... | G01S 15/08 |
| 2019/0225174 A1 * | 7/2019 | Wee | .................. | B60R 21/01336 |
| 2019/0377020 A1 * | 12/2019 | Bhalwankar | ......... | H02H 7/1216 |
| 2020/0320966 A1 * | 10/2020 | Clark | ..................... | G10H 1/182 |
| 2020/0412338 A1 * | 12/2020 | Villalon | ................. | H03H 11/04 |
| 2021/0199415 A1 * | 7/2021 | Yamada | ................... | G01B 7/105 |

* cited by examiner

VEHICLE CONTROLLER WITH COMPLEMENTARY CAPACITANCE FOR ANALOG-TO-DIGITAL CONVERTER (A/D) LOW PASS FILTER

CROSS-REFERENCE TO RELATED PATENT APPLICATION

This application claims benefit of and priority to U.S. Provisional Application No. 62/867,059, filed Jun. 26, 2019, incorporated herein by reference in its entirety.

TECHNICAL FIELD

The present disclosure relates generally to a controller, and more specifically, to a controller of a vehicle. The controller is capable of processing input signals of different frequency ranges.

BACKGROUND

A controller of a vehicle can control various functions of different systems and components of the vehicle. For example, the controller may manage various conditions to operate an engine, a battery system, a generator, a braking system, and/or an exhaust system of the vehicle. Among the various functions, the controller may include a input filter that receives an input signal, extending across a frequency range, to allow a portion of the input signal, extending across a portion of the frequency range, to pass through. A frequency boundary that separates the allowed portion of the input signal from the received input signal is frequently referred to as a cut-off frequency of the filter. For example, a low-pass filter is typically configured to allow a portion of the received input signal that has a frequency lower than the respective cut-off frequency to pass through.

Depending on other components in the system, the input received at a particular input terminal of the control may be expected to have different frequency ranges requiring different cutoff frequencies. There exists a need to provide a controller that can accept inputs having different frequency ranges and thereby requiring different cut-off frequencies at a particular input terminal.

SUMMARY

One embodiment relates to an engine control module. The engine control module comprises an input terminal configured to receive an input signal, an analog-to-digital converter configured to receive the input signal from the input terminal, control circuitry configured to receive the input signal from the analog-to-digital converter and to control at least one engine output based on the input signal, and an adjustable low-pass filter. The adjustable low-pass filter is coupled between the input terminal and the analog-to-digital converter such that the analog-to-digital converter receives the input signal from the input terminal via the adjustable low-pass filter. The adjustable low-pass filter is configured to filter the input signal from the input terminal prior to the input signal being applied to the analog-to-digital converter. The adjustable low-pass filter has a first setting in which the adjustable low-pass filter has a first cut-off frequency and a second setting in which the adjustable low-pass filter has a second cut-off frequency, wherein the first setting configures the engine control module to be used with a first sensor having a first dynamic range and the second setting configures the engine control module to be used with a second sensor having a second dynamic range.

In some embodiments, the input signal is received from the first sensor or the second sensor via the input terminal.

In some embodiments, the adjustable low-pass filter comprises a resistor, a first capacitor coupled to one end of the resistor, a second capacitor coupled to the one end of the resistor, and a first controllable switch coupled to the first capacitor. The first controllable switch is selectively turned on to conduct the first capacitor to cause the adjustable low-pass filter to provide either the first cut-off frequency or the second cut-off frequency. In some embodiments, a capacitance value of the first capacitor is greater than a capacitance value of the second capacitor.

In some embodiments, the adjustable low-pass filter further comprises a second controllable switch coupled to the second capacitor, the second controllable switch being selectively turned on to conduct the second capacitor.

In some embodiments, the adjustable low-pass filter is configured to: when the first and second capacitors conduct current, present the first cut-off frequency; when only the first capacitor conducts current, present the second cut-off frequency; or when only the second capacitor conducts current, present the third cut-off frequency. In some embodiments, the first cut-off frequency is less than the second and third cut-off frequencies.

Another embodiment relates to a method of processing control signals of different frequency ranges in a vehicle. The method comprises providing an input terminal configured to receive an input signal, an analog-to-digital converter configured to receive the input signal from the input terminal, control circuitry configured to receive the input signal from the analog-to-digital converter and to control at least one engine output based on the input signal, and an adjustable low-pass filter; coupling the adjustable low-pass filter between the input terminal and the analog-to-digital converter such that the analog-to-digital converter receives the input signal from the input terminal via the adjustable low-pass filter; configuring a first setting of the adjustable low-pass filter such that the adjustable low-pass filter has a first cut-off frequency and configuring a second setting such that the adjustable low-pass filter has a second cut-off frequency, wherein the first setting configures the engine control module to be used with a first sensor having a first dynamic range and the second setting configures the engine control module to be used with a second sensor having a second dynamic range; and causing the adjustable low-pass filter to filter the input signal from the input terminal prior to the input signal being applied to the analog-to-digital converter.

In some embodiments, the method comprises receiving the input signal from the first sensor or the second sensor via the input terminal.

In some embodiments, the adjustable low-pass filter comprises a resistor, a first capacitor coupled to one end of the resistor, a second capacitor coupled to the one end of the resistor, and a first controllable switch coupled to the first capacitor. The method further comprises selectively turning on the first controllable switch to conduct the first capacitor such that the adjustable low-pass filter provides either the first cut-off frequency or the second cut-off frequency.

In some embodiments, a capacitance value of the first capacitor is greater than a capacitance value of the second capacitor. In some embodiments, the adjustable low-pass filter further comprises a second controllable switch coupled to the second capacitor, the method further comprising selectively turning on the second controllable switch to conduct the second capacitor.

In some embodiments, the method comprises configuring the adjustable low-pass filter to: when the first and second capacitors conduct current, present the first cut-off frequency; when only the first capacitor conducts current, present the second cut-off frequency; or when only the second capacitor conducts current, present the third cut-off frequency. In some embodiments, the first cut-off frequency is less than the second and third cut-off frequencies.

Another embodiment relates to a computer-readable medium containing computer-executable instructions stored thereon, the instructions, when executed by at least one processor of an electronic control module, cause the electronic control module to perform operations to process control signals of different frequency ranges, the instructions comprising: configuring a first setting of an adjustable low-pass filter such that the adjustable low-pass filter has a first cut-off frequency and configuring a second setting of the adjustable low-pass filter such that the adjustable low-pass filter has a second cut-off frequency, wherein the first setting configures the engine control module to be used with a first sensor having a first dynamic range and the second setting configures the engine control module to be used with a second sensor having a second dynamic range; receiving an input signal from the first sensor or the second sensor via an input terminal; causing the adjustable low-pass filter to filter the input signal from the input terminal; and causing the adjustable low-pass filter to apply the input signal to an analog-to-digital converter such that at least one engine output is controlled based on the input signal. The adjustable low-pass filter is coupled between the input terminal and the analog-to-digital converter such that the analog-to-digital converter receives the input signal from the input terminal via the adjustable low-pass filter.

In some embodiments, the instructions comprise receiving the input signal from the first sensor or the second sensor via the input terminal.

In some embodiments, the adjustable low-pass filter comprises a resistor, a first capacitor coupled to one end of the resistor, a second capacitor coupled to the one end of the resistor, and a first controllable switch coupled to the first capacitor. The instructions comprise selectively turning on the first controllable switch to conduct the first capacitor such that the adjustable low-pass filter provides either the first cut-off frequency or the second cut-off frequency.

In some embodiments, a capacitance value of the first capacitor is greater than a capacitance value of the second capacitor.

In some embodiments, the adjustable low-pass filter further comprises a second controllable switch coupled to the second capacitor, and the instructions comprise selectively turning on the second controllable switch to conduct the second capacitor.

In some embodiments, the instructions comprise configuring the adjustable low-pass filter to: when the first and second capacitors conduct current, present the first cut-off frequency; when only the first capacitor conducts current, present the second cut-off frequency; or when only the second capacitor conducts current, present the third cut-off frequency. In some embodiments, the first cut-off frequency is less than the second and third cut-off frequencies.

BRIEF DESCRIPTION OF THE FIGURES

The foregoing and other features of the present disclosure will become more fully apparent from the following description and appended claims taken in conjunction with the accompanying figures. Understanding that these figures depict only several implementations in accordance with the disclosure and are therefore not to be considered limiting of its scope, the disclosure will be described with additional specificity and detail through use of the accompanying drawings.

Reference is made to the accompanying figures throughout the following detailed description. In the figures, similar symbols typically identify similar components unless context dictates otherwise. The illustrative implementations described in the detailed description, figures, and claims are not meant to be limiting. Other implementations may be utilized, and other changes may be made, without departing from the spirit or scope of the subject matter presented here. It will be readily understood that the aspects of the present disclosure, as generally described herein and illustrated in the figures, can be arranged, substituted, combined, and designed in a wide variety of different configurations, all of which are explicitly contemplated and made part of this disclosure.

DETAILED DESCRIPTION

Following below are more detailed descriptions of various concepts related to, and implementations of, methods, apparatuses, and systems for predictive control of operating parameters of a vehicle. The various concepts introduced above and discussed in greater detail below may be implemented in any number of ways, as the concepts described are not limited to any particular manner of implementation. Examples of specific implementations and applications are provided primarily for illustrative purposes.

Referring to the Figures generally, the various embodiments disclosed herein relate to systems and apparatuses of a controller of a vehicle (sometimes referred to as a "vehicle controller"), and to methods for operating the same. In some embodiments, the controller can accept input signals with different frequency ranges at a single input terminal. When the controller receives an input signal that extends across a frequency range, the controller may use one or more selection signals to activate respective components (e.g., capacitors with different capacitance values) of a sub-circuit. For example, the controller may use a selection signal to alternatively activate one of two capacitors while keeping the other one deactivated, or multiple selection signals to activate one or both of the two capacitors. As such, when one of the two capacitors is de-activated, the controller can provide a higher cut-off frequency; and when both of the two capacitors are activated, the controller can provide a lower cut-off frequency. Accordingly, the controller can allow respective portions of the input signal extending different frequency ranges to pass through.

Figure 1:
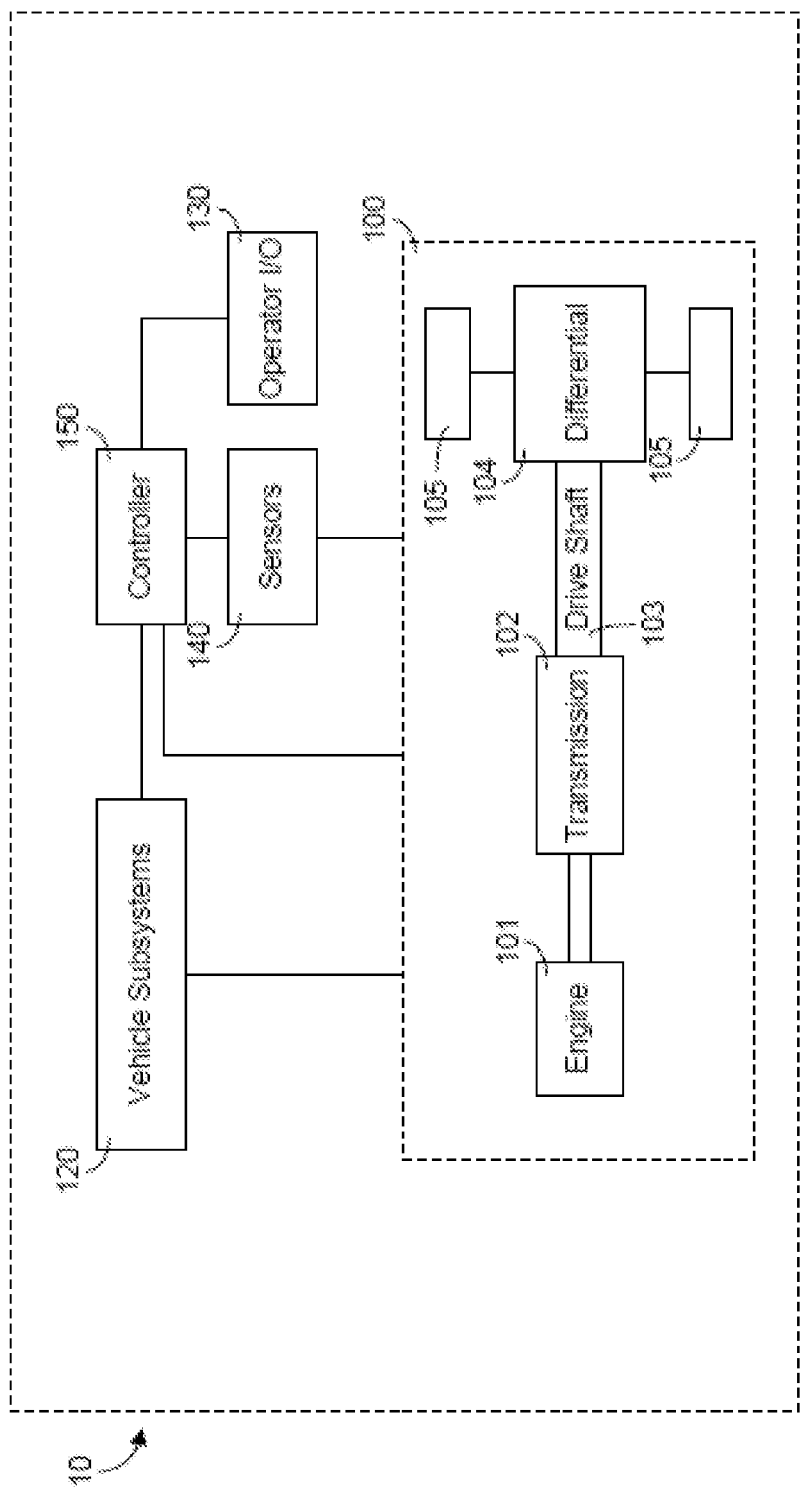
FIG. 1 is a schematic illustration of a vehicle including a controller, according to an embodiment.

Referring to FIG. 1, a schematic diagram of a vehicle 10 is shown according to various example embodiments. The vehicle 10 includes a powertrain 100, one or more vehicle subsystems 120, an operator input/output (I/O) device 130, sensors 140 communicably coupled to one or more components of the vehicle 10, and a vehicle controller 150. These components are described more fully herein.

In some embodiments, the powertrain 100 is structured as a conventional, non-hybrid, non-electric powertrain (i.e., an internal combustion engine driven powertrain). The vehicle 10 may be an on-road or an off-road vehicle including, but not limited to, line-haul trucks, mid-range trucks (e.g., pick-up truck), cars (e.g., sedans, hatchbacks, coupes, etc.), buses, vans, refuse vehicles, fire trucks, concrete trucks, delivery trucks, and any other type of vehicle. Thus, the present disclosure is applicable with a wide variety of implementations.

Components of the vehicle 10 may communicate with each other or off-board components using any type and any number of wired or wireless connections. For example, a wired connection may include a serial cable, a fiber optic cable, a CAT5 cable, or any other form of wired connection. Wireless connections may include the Internet, Wi-Fi, cellular, radio, Bluetooth, ZigBee, etc. In one embodiment, a controller area network (CAN) bus provides the exchange of signals, information, and/or data. The CAN bus includes any number of wired and wireless connections. Because the vehicle controller 150 is communicably coupled to the systems and components in the vehicle 10, the vehicle controller 150 is structured to receive data regarding one or more of the components shown in FIG. 1. For example, the data may include operation data regarding the operating conditions of the powertrain 100 and/or other components (e.g., a battery system, a motor, a generator, a regenerative braking system, an engine, an exhaust aftertreatment system, etc.) acquired by one or more sensors, such as sensors 140. As another example, the data may include an input received by the operator I/O device 130. The vehicle controller 150 may determine how to control the powertrain 100 at least in part based on the data.

As shown in FIG. 1, the powertrain 100 (e.g., a series hybrid powertrain, etc.) includes an engine 101, a transmission 102, a driveshaft 103, a differential 104, and a final drive 105. The engine 101 may be structured as any engine type, including a spark-ignition internal combustion engine, a compression-ignition internal combustion engine, and/or a fuel cell, among other alternatives. The engine 101 may be powered by any fuel type (e.g., diesel, ethanol, gasoline, natural gas, propane, hydrogen, etc.). The transmission 102 receives the rotating crankshaft and manipulates the speed of the crankshaft (e.g., the engine revolutions-per-minute (RPM), etc.) to affect a desired driveshaft speed. The rotating driveshaft 103 is received by the differential 104, which provides the rotation energy of the driveshaft 103 to the final drive 105. The final drive 105 then propels or moves the vehicle 10.

Similarly, the transmission 102 may be structured as any type of transmission, such as a continuous variable transmission, a manual transmission, an automatic transmission, an automatic-manual transmission, a dual clutch transmission, and so on. Accordingly, as transmissions vary from geared to continuous configurations (e.g., continuous variable transmission), the transmission 102 may include a variety of settings (gears, for a geared transmission) that affect different output speeds based on an input speed received thereby. Like the engine 101 and the transmission 102, the driveshaft 103, the differential 104, and/or the final drive 105 may be structured in any configuration dependent on the application (e.g., the final drive 105 is structured as wheels in an automotive application and a propeller in a boat application, etc.). Further, the driveshaft 103 may be structured as any type of driveshaft including, but not limited to, a one-piece, two-piece, and a slip-in-tube driveshaft based on the application.

Referring still to FIG. 1, the vehicle 10 includes the vehicle subsystems 120. The vehicle subsystems 120 may include other components including mechanically driven or electrically driven vehicle components (e.g., HVAC system, lights, pumps, fans, etc.). The vehicle subsystems 120 may also include an exhaust aftertreatment system having components used to reduce exhaust emissions, such as selective catalytic reduction (SCR) catalyst, a diesel oxidation catalyst (DOC), a diesel particulate filter (DPF), a diesel exhaust fluid (DEF) doser with a supply of diesel exhaust fluid, a plurality of sensors for monitoring the aftertreatment system (e.g., a nitrogen oxide (NOx) sensor, temperature sensors, etc.), and/or still other components.

The operator I/O device 130 may enable an operator of the vehicle 10 (or passenger) to communicate with the vehicle 10 and the vehicle controller 150. By way of example, the operator I/O device 130 may include, but is not limited to, an interactive display, a touchscreen device, one or more buttons and switches, voice command receivers, and the like. In one embodiment, the operator I/O device 130 includes a brake pedal or a brake lever, an accelerator pedal, and/or an accelerator throttle.

The sensors 140 may include sensors positioned and/or structured to monitor operating characteristics or parameters of various components of the vehicle 10. The sensors 140 may additionally or alternatively include a position sensor structured to facilitate monitoring the position of the accelerator (e.g., accelerator pedal, accelerator throttle, etc.) and/or the brake (e.g., brake pedal, brake lever, etc.) of the vehicle 10. The sensors 140 may additionally or alternatively include a speed sensor structured to facilitate monitoring the speed of the vehicle 10 and/or the primary driver (e.g., the engine 101). The sensors 140 may additionally or alternatively include aftertreatment sensors (e.g., NOx sensors, temperature sensors, etc.) structured to facilitate monitoring the temperature of components of the exhaust aftertreatment system, the temperature of the exhaust gases, and/or the composition of the exhaust gasses. The sensors 140 may additionally or alternatively includes sensors structured to facilitate monitoring a torque and/or power output of the primary driver (e.g., the engine 101). The sensors 140 may additionally or alternatively includes sensors structured to facilitate monitoring a current transmission gear selection of the transmission 102.

As the components of FIG. 1 are shown to be embodied in the vehicle 10, the vehicle controller 150 may be structured as one or more electronic control units (ECU). As such, the vehicle controller 150 may be separate from or included with at least one of a transmission control unit, an exhaust aftertreatment control unit, a powertrain control module, an engine control module, etc. The function and structure of the vehicle controller 150 is described in greater detail with respect to FIG. 2.

Figure 2:
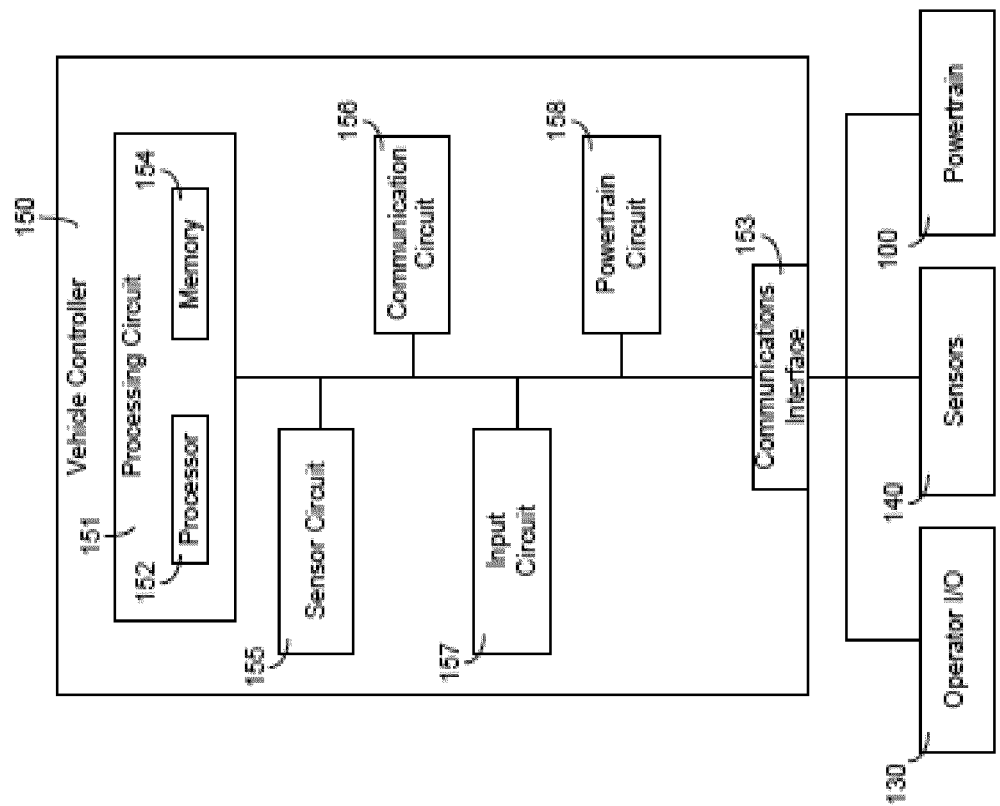
FIG. 2 is a schematic block diagram of the controller of the vehicle of FIG. 1, according to an embodiment.

Referring now to FIG. 2, a schematic diagram of the vehicle controller 150 of the vehicle 10 of FIG. 1 is shown according to an example embodiment. As shown in FIG. 2, the vehicle controller 150 includes a processing circuit 151 having a processor 152 and a memory 154; a communications interface 153; a sensor circuit 155; a communication circuit 156; an input circuit 157; and a powertrain circuit 158.

In one configuration, the sensor circuit 155, the communication circuit 156, the input circuit 157, and the powertrain circuit 158 are embodied as machine or computer-readable media that is executable by a processor, such as the processor 152. As described herein and amongst other uses, the machine-readable media facilitates performance of certain operations to enable reception and transmission of data. For example, the machine-readable media may provide an instruction (e.g., command, etc.) to, e.g., acquire data. In this regard, the machine-readable media may include programmable logic that defines the frequency of acquisition of the data (or, transmission of the data). Thus, the computer readable media may include code, which may be written in any programming language including, but not limited to, Java or the like and any conventional procedural programming languages, such as the "C" programming language or similar programming languages. The computer readable program code may be executed on one processor or multiple remote processors. In the latter scenario, the remote processors may be connected to each other through any type of network (e.g., CAN bus, etc.).

In another configuration, the sensor circuit 155, the communication circuit 156, the input circuit 157, and the powertrain circuit 158 are embodied as hardware units, such as electronic control units. As such, the sensor circuit 155, the communication circuit 156, the input circuit 157, and/or the powertrain circuit 158 may be embodied as one or more circuitry components including, but not limited to, processing circuitry, network interfaces, peripheral devices, input devices, output devices, sensors, etc. In some embodiments, the sensor circuit 155, the communication circuit 156, the input circuit 157, and/or the powertrain circuit 158 may take the form of one or more analog circuits, electronic circuits (e.g., integrated circuits (IC), discrete circuits, system on a chip (SOCs) circuits, microcontrollers, etc.), telecommunication circuits, hybrid circuits, and any other type of "circuit." In this regard, the sensor circuit 155, the communication circuit 156, the input circuit 157, and/or the powertrain circuit 158 may include any type of component for accomplishing or facilitating achievement of the operations described herein.

For example, a circuit, or sub-circuit, as described herein may include one or more transistors, logic gates (e.g., NAND, AND, NOR, OR, XOR, NOT, XNOR, etc.), resistors, multiplexers, registers, capacitors, inductors, diodes, wiring, and so on. Thus, the sensor circuit 155, the communication circuit 156, the input circuit 157, and/or the powertrain circuit 158 may also include programmable hardware devices such as field programmable gate arrays, programmable array logic, programmable logic devices or the like. In this regard, the sensor circuit 155, the communication circuit 156, the input circuit 157, and/or the powertrain circuit 158 may include one or more memory devices for storing instructions that are executable by the processor(s) of the sensor circuit 155, the communication circuit 156, the input circuit 157, and/or the powertrain circuit 158. The one or more memory devices and processor(s) may have the same definition as provided below with respect to the memory 154 and the processor 152. Thus, in this hardware unit configuration, the sensor circuit 155, the communication circuit 156, the input circuit 157, and/or the powertrain circuit 158 may be geographically dispersed throughout separate locations in the vehicle 10 (e.g., separate control units, etc.). Alternatively and as shown, the sensor circuit 155, the communication circuit 156, the input circuit 157, and/or the powertrain circuit 158 may be embodied in or within a single unit/housing, which is shown as the vehicle controller 150.

In the example shown, the vehicle controller 150 includes the processing circuit 151 having the processor 152 and the memory 154. The processing circuit 151 may be structured or configured to execute or implement the instructions, commands, and/or control processes described herein with respect to the sensor circuit 155, the communication circuit 156, the input circuit 157, and/or the powertrain circuit 158. Thus, the depicted configuration represents the aforementioned arrangement where the sensor circuit 155, the communication circuit 156, the input circuit 157, and/or the powertrain circuit 158 are embodied as machine or computer-readable media. However, as mentioned above, this illustration is not meant to be limiting as the present disclosure contemplates other embodiments such as the aforementioned embodiment where the sensor circuit 155, the communication circuit 156, the input circuit 157, and/or the powertrain circuit 158, or at least one circuit of the sensor circuit 155, the communication circuit 156, the input circuit 157, and/or the powertrain circuit 158, are configured as a hardware unit. All such combinations and variations are intended to fall within the scope of the present disclosure.

The processor 152 may be implemented as one or more general-purpose processors, an application specific integrated circuit (ASIC), one or more field programmable gate arrays (FPGAs), a digital signal processor (DSP), a group of processing components, or other suitable electronic processing components. In some embodiments, the one or more processors may be shared by multiple circuits (e.g., the sensor circuit 155, the communication circuit 156, the input circuit 157, and/or the powertrain circuit 158 may comprise or otherwise share the same processor which, in some example embodiments, may execute instructions stored, or otherwise accessed, via different areas of memory). Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. All such variations are intended to fall within the scope of the present disclosure. The memory 154 (e.g., RAM, ROM, Flash Memory, hard disk storage, etc.) may store data and/or computer code for facilitating the various processes described herein. The memory 154 may be communicably connected to the processor 152 to provide computer code or instructions to the processor 152 for executing at least some of the processes described herein. Moreover, the memory 154 may be or include tangible, non-transient volatile memory or non-volatile memory. Accordingly, the memory 154 may include database components, object code components, script components, or any other type of information structure for supporting the various activities and information structures described herein.

The communications interface 153 may include any number and type of wired or wireless interfaces (e.g., jacks, antennas, transmitters, receivers, transceivers, wire terminals, etc.) for conducting data communications with various systems, devices, or networks. For example, the communications interface 153 may include an Ethernet card and port for sending and receiving data via an Ethernet-based communications network and/or a Wi-Fi transceiver for communicating via a wireless communications network. The communications interface 153 may be structured to communicate via local area networks or wide area networks (e.g., the Internet, etc.) and may use a variety of communications protocols (e.g., IP, LON, Bluetooth, ZigBee, radio, cellular, near field communication, etc.).

The communications interface 153 of the vehicle controller 150 may facilitate communication between and among the vehicle controller 150, and/or one or more components of the vehicle 10 (e.g., components of the powertrain 100, the vehicle subsystems 120, the operator I/O device 130, the sensors 140, etc.). Communication between and among the vehicle controller 150, and/or the components of the vehicle 10 may be via any number of wired or wireless connections (e.g., any standard under IEEE 802, etc.). For example, a wired connection may include a serial cable, a fiber optic cable, a CAT5 cable, or any other form of wired connection. In comparison, a wireless connection may include the Internet, Wi-Fi, cellular, Bluetooth, ZigBee, radio, etc. In one embodiment, a controller area network (CAN) bus provides the exchange of signals, information, and/or data. The CAN bus can include any number of wired and wireless connections that provide the exchange of signals, information, and/or data. The CAN bus may include a local area network (LAN), or a wide area network (WAN), or the connection may be made to an external computer (for example, through the Internet using an Internet Service Provider).

The sensor circuit 155 is structured to receive or acquire operating data from the sensors 140 regarding operating characteristics or parameters of one or more components of the vehicle 10. By way of example, the operating parameters may include an engine speed, an engine torque, a vehicle speed, a transmission gear selection, an exhaust aftertreatment system temperature, and/or a battery system temperature, among other possible parameters.

The communication circuit 156 is structured to facilitate controlling communication between the vehicle controller 150 and one or more external systems via the communications interface 153. In some embodiments, such external systems may include at least one of the following: a route look-ahead system, a weather system, and a GPS system.

The input circuit 157 is structured to receive an input from an operator of the vehicle 10 via the operator I/O device 130. By way of example, the input may include a current location and/or a desired destination for the vehicle 10 (e.g., for use by the aforementioned GPS system). By way of another example, the input may include a selection of a route of travel for the vehicle 10 based on one or more possible routes.

The powertrain circuit 158 is structured to control the one or more components (e.g., the engine 101, the transmission 102, etc.) of a powertrain (e.g., the powertrain 100) of the vehicle 10.

In accordance with some embodiments, each of the sensor circuit 155, communication circuit 156, input circuit 157, and powertrain circuit 158 of the vehicle controller 150 may be implemented in hardware, or a combination of hardware and software. The communication interface 153 may include at least one sub-circuit (e.g., the subcircuit shown in either FIG. 3 or FIG. 4) that is structured to receive an input signal (e.g., from a sensor) and provide an output signal to one of the remaining circuits 155-158 (e.g., to the sensor circuit 155). In various embodiments, the subcircuit may be a low pass filter, and the input frequency of the input signal may be in different frequency ranges, and the low pass filter may have a different cutoff frequency, depending on a particular application. The subcircuit may be configured to receive a selection signal to configure the subcircuit, e.g., to operate within a first frequency range or a second frequency, or to operate within one of first, second, and third frequency ranges (or possibly additional frequency ranges), depending on the application. That is, the selection signal may be used to configure the cutoff frequency of the low pass filter, depending on the application. Various example circuit diagrams of the embodiments of such a sub-circuit is shown in FIGS. 3 and 4.

Figure 3:
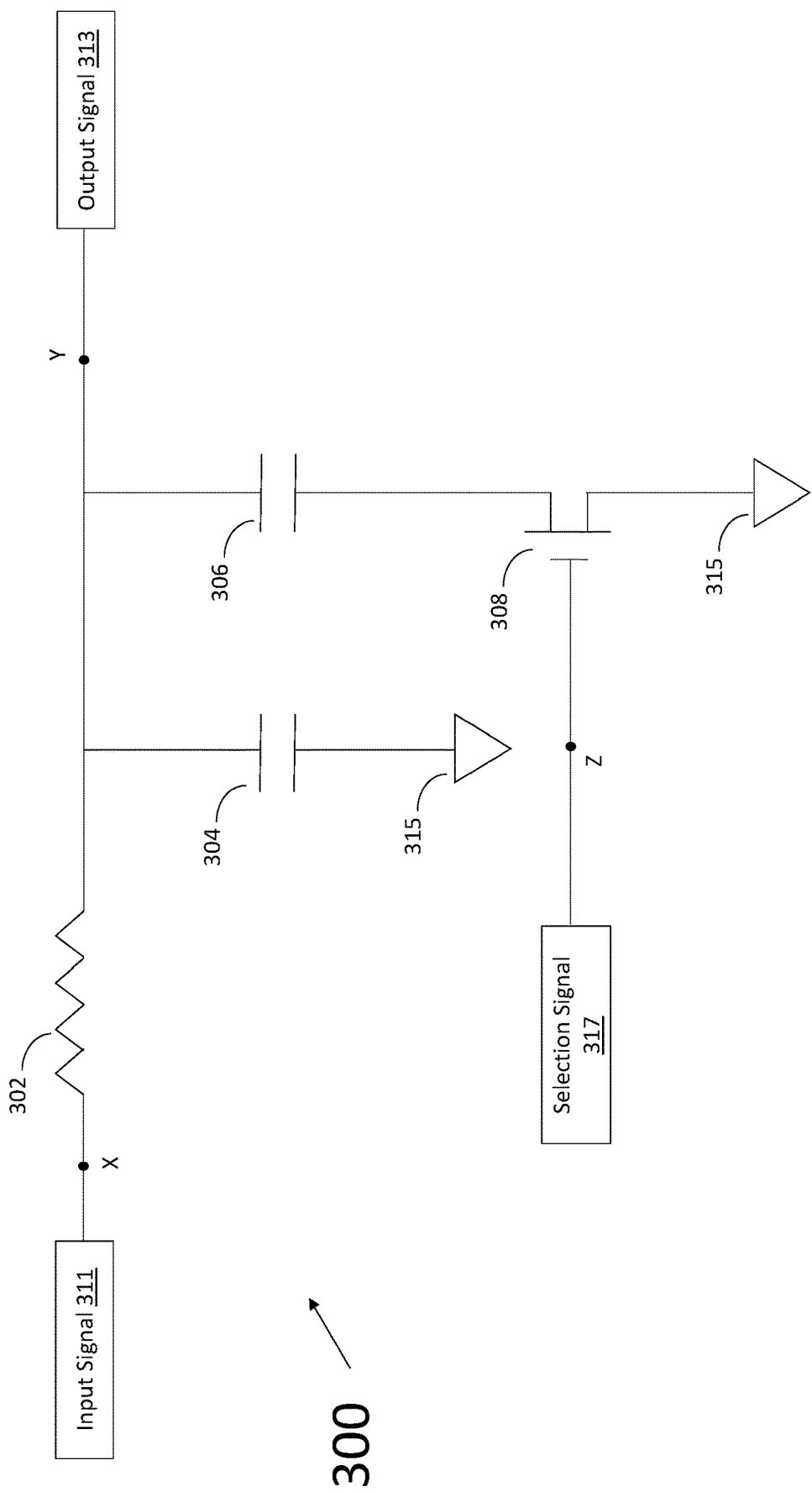
FIG. 3 is an example circuit diagram of a sub-circuit of the controller of FIG. 2, the sub-circuit structured to provide multiple cut-off frequencies, according to an embodiment.
Figure 4:
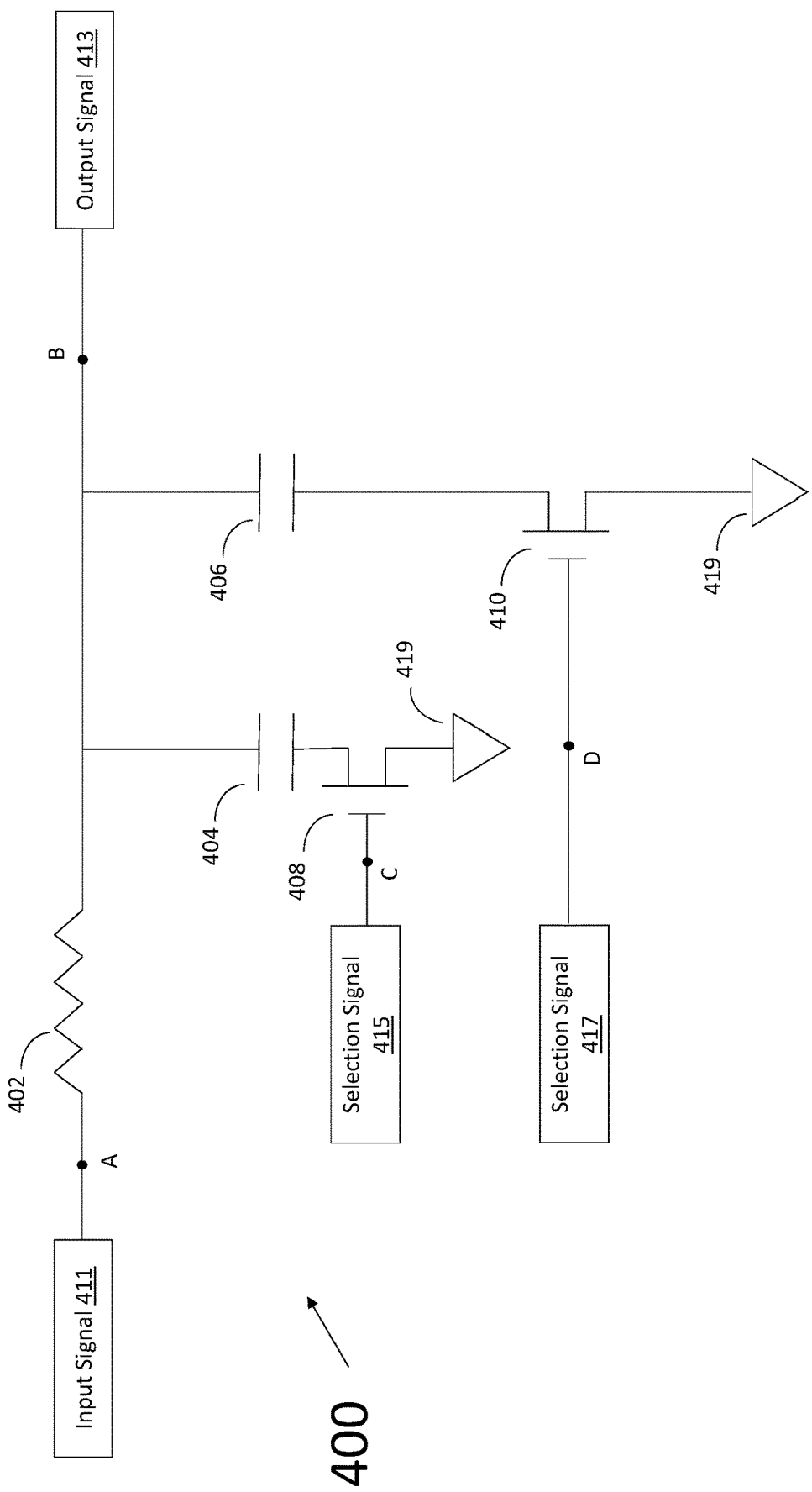
FIG. 4 is another example circuit diagram of a sub-circuit of the controller of FIG. 2, the sub-circuit structured to provide multiple cut-off frequencies, according to an embodiment.

Referring first to FIG. 3, an example circuit diagram of a low pass filter sub-circuit 300, structured to provide multiple cut-off frequencies, is shown, in accordance with some embodiments. As shown, the sub-circuit 300 includes a resistor 302, a first capacitor 304, a second capacitor 306, and a controllable switch 308 (e.g., a metal-oxide-semiconductor field-effect-transistor (MOSFET), a digital switch, an analog switch, etc.). In some embodiments, one end of the resistor 302 coupled to node "X" is structured to receive an input signal 311, and the other end of the resistor 302 coupled to node "Y" is structured to provide an output signal 313 of the sub-circuit. Further, the node Y is commonly coupled to one end of the capacitor 304 and one end of the capacitor 306, and the other end of the capacitor 304 is coupled to a reference voltage 315, e.g., ground, and the other end of the capacitor 306 is coupled to a first end of the controllable switch 308. In the example where the controllable switch 308 is implemented as a MOSFET, a gate of the controllable switch 308, herein referred to as node "Z," is structured to receive a selection signal 317, and the controllable switch 308's source and drain or drain and source are respectively coupled to the reference voltage 315 and the capacitor 306, as shown in FIG. 3.

The selection signal 317 can be a voltage signal that includes at least two different levels, which can selectively turn on or off the controllable switch 308. For example, when the selection signal 317 is at a first level, which corresponds to a logical high (a logical 1), the controllable switch 308 (when implemented as an n-type MOSFET) is turned on (rendered conductive or activated); and when the selection signal 317 is at a second level, which corresponds to a logical low (a logical 0), the controllable switch 308 (when implemented as an n-type MOSFET) is turned off (de-activated).

When the controllable switch 308 is turned on, the capacitor 306 conducts current, which causes both of the capacitors 304 and 306 to connect to the resistor 302. Specifically, both of the capacitors 304 and 306, now connected in parallel, together with the resistor 302 constitute a low-pass filter having a cut-off frequency f1, $$\frac{1}{2\pi R_{302}(C_{304} + C_{306})},$$

where R302 represents a resistance value of the resistor 302, C304 represents a capacitance value of the capacitor 304, and C306 represents a capacitance value of the capacitor 306. On the other hand, when the controllable switch 308 is turned off, the capacitor 306 does not conduct current, which causes only the capacitor 304 to connect to the resistor 302. Specifically, the capacitor 304 together with the resistor 302 constitute another low-pass filter having a cut-off frequency f2, $$\frac{1}{2\pi R_{302} C_{304}},$$

where R302 represents a resistance value of the resistor 302, and C304 represents a capacitance value of the capacitor 304. As discussed above, by selectively turning on or off the controllable switch 308 (e.g., through the selection signal 317), at least two different low-pass filters with respective different cut-off frequencies can be formed, or an adjustable low-pass filter including at least 2 different settings can be formed. Accordingly, the output signal 313 can present respective different frequency ranges that occupy portions of the frequency range of the received input signal 411 with the turned-on or off controllable switch 308. Operations of the sub-circuit 300 shall be discussed further with respect to the method 500 of FIG. 5.

In some embodiments, R302 may be configured as about 32.4 kΩ and C306 may be configured to be greater than C304. For example, C304 may be configured as about 0.01 μF and C306 may be configured as about 0.33 μF. As such, the cut-off frequency f1 (when the controllable switch 308 is turned on) may be about 14.89 Hz, and the cut-off frequency f2 (when the controllable switch 308 is turned off) may be about 490 Hz. The values of R302, C304, and C306 are not limited in the above example, such that R302, C304, and C306 can be configured as any respective values while remaining within the scope of the present disclosure.

Referring then to FIG. 4, an example circuit diagram of another sub-circuit 400, structured to provide multiple cut-off frequencies, is shown, in accordance with some embodiments. The sub-circuit 400 is substantially similar to the sub-circuit 300 except that the sub-circuit 400 further includes at least another controllable switch connected to one of the capacitors, which allows the sub-circuit 400 to provide at least one additional cut-off frequency.

As shown in FIG. 4, the sub-circuit 400 includes a resistor 402, a first capacitor 404, a second capacitor 406, a first controllable switch 408, and a second controllable switch 410. Similarly, each of the first and second controllable switches 408 and 410 may be implemented as a metal-oxide-semiconductor field-effect-transistor (MOSFET). In some embodiments, one end of the resistor 402 coupled to node "A" is structured to receive an input signal 411, and the other end of the resistor 402 coupled to node "B" is structured to provide an output signal 413. Further, the node B is commonly coupled to one end of the capacitor 404 and one end of the capacitor 406, and the other end of the capacitor 404 is coupled to a first end of the controllable switch 408 and the other end of the capacitor 406 is coupled to a first end of the controllable switch 410. In the example where the controllable switches 408 and 410 are each implemented as a MOSFET, a gate of the controllable switch 408, herein referred to as node "C," is structured to receive a first selection signal 415, and a gate of the controllable switch 410, herein referred to as node "D," is structured to receive a second selection signal 417. The controllable switch 408's source and drain or drain and source are respectively coupled to reference voltage 419 (e.g., ground) and the capacitor 404, and the controllable switch 410's source and drain or drain and source are respectively coupled to the reference voltage 419 and the capacitor 406, as shown in FIG. 4.

In some embodiments, the input signal 411 can be any signal received by the sensor circuit 155, communication circuit 156, input circuit 157, or powertrain circuit 158 of the vehicle controller 150 that extends across a frequency range. The selection signals 415 and 417 can each be a voltage signal that includes at least two different levels that correspond to a logical 1 and a logical 0, respectively. In some embodiments, combinations of the respective logical states of the selection signals 415 and 417 may include: (logical 1, logical 1), (logical 1, logical 0), (logical 0, logical 1), and (logical 0, logical 0). In accordance with the different combinations of the logical states of the selection signals 415 and 417, various different combinations of the turned-on and off controllable switches 408 and 410 can be provided. For example, when the selection signal 415 is at logical 1 and the selection signal 417 is also at logical 1, the controllable switches 408 and 410 (when both implemented as an n-type MOSFET) are both turned on (rendered conductive or activated); when the selection signal 415 is at logical 1 and the selection signal 417 is also at logical 0, the controllable switches 408 and 410 (when both implemented as an n-type MOSFET) are turned on and off, respectively; when the selection signal 415 is at logical 0 and the selection signal 417 is also at logical 1, the controllable switches 408 and 410 (when both implemented as an n-type MOSFET) are turned off and on, respectively; and when the selection signal 415 is at logical 0 and the selection signal 417 is also at logical 0, the controllable switches 408 and 410 (when both implemented as an n-type MOSFET) are both turned off.

When the controllable switches 408 and 410 are both turned on (both of the selection signals 415 and 417 are at logical 1 in the above example), the capacitors 404 and 406 both conduct current, which causes both of the capacitors 404 and 406 to connect to the resistor 402. Specifically, both of the capacitors 404 and 406, now connected in parallel, together with the resistor 402 constitute a low-pass filter having a cut-off frequency f3, $$\frac{1}{2\pi R_{402}(C_{404} + C_{406})},$$

where R402 represents a resistance value of the resistor 402, C404 represents a capacitance value of the capacitor 404, and C406 represents a capacitance value of the capacitor 406. When the controllable switches 408 is turned on (the selection signal 415 is at logical 1 in the above example) and the controllable switches 410 is turned off (the selection signal 417 is at logical 0 in the above example), the capacitor 404 conducts current and the capacitor 406 does not conduct current, which causes only the capacitor 404 to connect to the resistor 402. Specifically, the capacitor 404 together with the resistor 402 constitute another low-pass filter having a cut-off frequency f4, $$\frac{1}{2\pi R_{402} C_{404}}.$$

When the controllable switch 408 is turned off (the selection signal 415 is at logical 0 in the above example) and the controllable switch 410 is turned on (the selection signal 417 is at logical 1 in the above example), the capacitor 404 does not conduct current and the capacitor 406 does conduct current, which causes only the capacitor 406 to connect to the resistor 402. As such, the capacitor 406 together with the resistor 402 constitute yet another low-pass filter having a cut-off frequency f5, $$\frac{1}{2\pi R_{402} C_{406}}.$$

Although when both of the selection signals 415 and 417 are at logical 0 in the above example (where the controllable switches 408 and 410 are implemented as n-type MOSFETs), the capacitors 404 and 406 do not conduct current, when the controllable switches 408 and 410 are each implemented as a different type of switch (e.g., a p-type MOSFET), such p-type MOSFET 408 and 410 can be both turned on by the logical 0 selection signals 415 and 417. As such, the sub-circuit 400 can form a low-pass filter presenting a cut-off frequency substantially similar to D.

As discussed above, by selectively turning on or off the controllable switches 408 and 410 (e.g., through the selection signals 415 and 417), different low-pass filters with respective different cut-off frequencies can be formed. Accordingly, the output signal 413 can present respective different frequency ranges that occupy portions of the frequency range of the received input signal 411 with the turned-on or off controllable switches 408 and 410. Operations of the sub-circuit 400 shall be discussed further with respect to the method 600 of FIG. 6.

In some embodiments, R402 may be configured as about 32.4 kΩ and C406 may be configured to be greater than C404. For example, C404 may be configured as about 0.01 μF and C406 may be configured as about 0.33 μF. As such, the cut-off frequency f3 (when the controllable switches 408 and 410 are both turned on) may be about 14.89 Hz, the cut-off frequency f4 (when the controllable switch 408 is turned on and the controllable switch 410 is turned off) may be about 490 Hz, and the cut-off frequency f5 (when the controllable switch 408 is turned off and the controllable switch 410 is turned on) may be about 14.85 Hz. The values of R402, C404, and C406 are not limited in the above example, such that R402, C404, and C406 can be configured as any respective values while remaining within the scope of the present disclosure.

Figure 5:
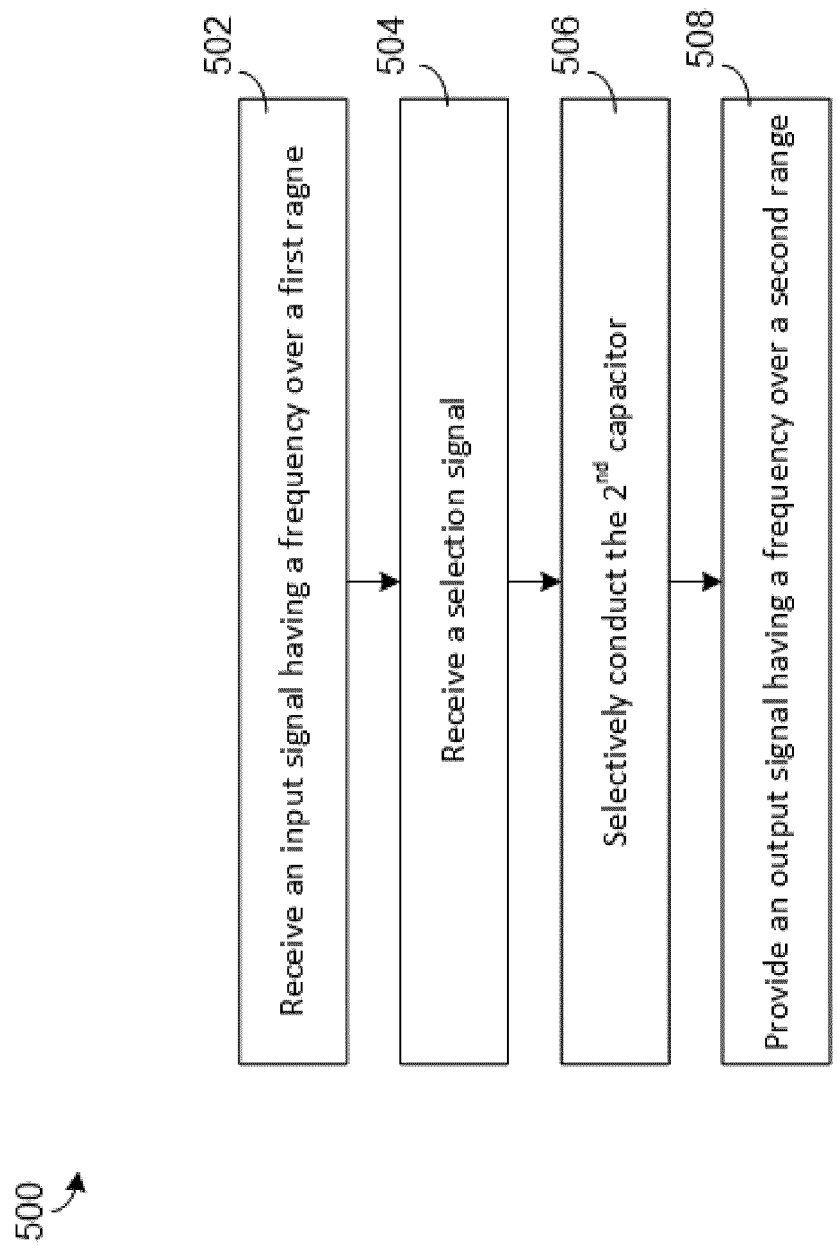
FIG. 5 is a flow chart of an example method to operate the sub-circuit of FIG. 3, according to an embodiment.

FIG. 5 illustrates a flow chart of an example method 500 to operate the sub-circuit 300, in accordance with various embodiments. In various embodiments, the operations of the method 500 are performed by the respective components illustrated in FIGS. 1-3. For purposes of discussion, the following embodiment of the method 500 will be described in conjunction with FIGS. 1-3. The illustrated embodiment of the method 500 is merely an example. Therefore, it should be understood that any of a variety of operations may be omitted, re-sequenced, and/or added while remaining within the scope of the present disclosure.

In some embodiments, the method 500 starts with operation 502 in which the sub-circuit 300 receives an input signal (e.g., 311) having a frequency extending across a first frequency range. The sub-circuit 300 may receive the input signal 311 at node X of the example circuit diagram of FIG. 3.

Prior to, simultaneously with, or subsequently to receiving the input signal 311, the sub-circuit 300 may receive a selection signal (e.g., 317) at node Z, which is tied to a control node (e.g., a gate) of the controllable switch 308 (operation 504). Such a selection signal 317 may present either logical 1 or logical 0.

Next, the method 500 proceeds to operation 506 in which the capacitor 308 is selectively activated. In some embodiments, in response to the selection signal 317 presenting logical 1, the controllable switch 308 (when implemented as an n-type MOSFET) is activated or turned on, which conducts the capacitor 306; and in response to the selection signal 317 presenting logical 0, the controllable switch 308 (when implemented as an n-type MOSFET) is de-activated or turned off, which isolates the capacitor 306 from conducting current. As discussed above, when the capacitor 306 conducts current, the resistor 302, together with both of the capacitors 304 and 306 that are connected in parallel, can form a first low-pass filter with cut-off frequency f1; and when the capacitor 306 does not conduct current, the resistor 302, together with only the capacitor 304, can form a second low-pass filter with cut-off frequency f2.

The method 500 proceeds to operation 508 in which the sub-circuit 300 provides an output signal (e.g., 313) having a frequency extending across a second frequency range. In some embodiments, the second frequency range occupies a lower portion of the first frequency range of the input signal 311. Continuing with the above example, when the first low-pass filter is formed (both of the capacitors 304 and 306 conduct current), a portion of the input signal 311 is allowed to pass through the first low-pass filter to form the output signal 313. Specifically, the allowed portion of the input signal 311 (i.e., the output signal 313) presents a second frequency range occupying a portion of the first frequency range that is lower than f1. Similarly, when the second low-pass filter is formed (only the capacitor 304 conducts current), the second frequency range of the output signal 313 occupies a portion of the first frequency range that is lower than f2.

Figure 6:
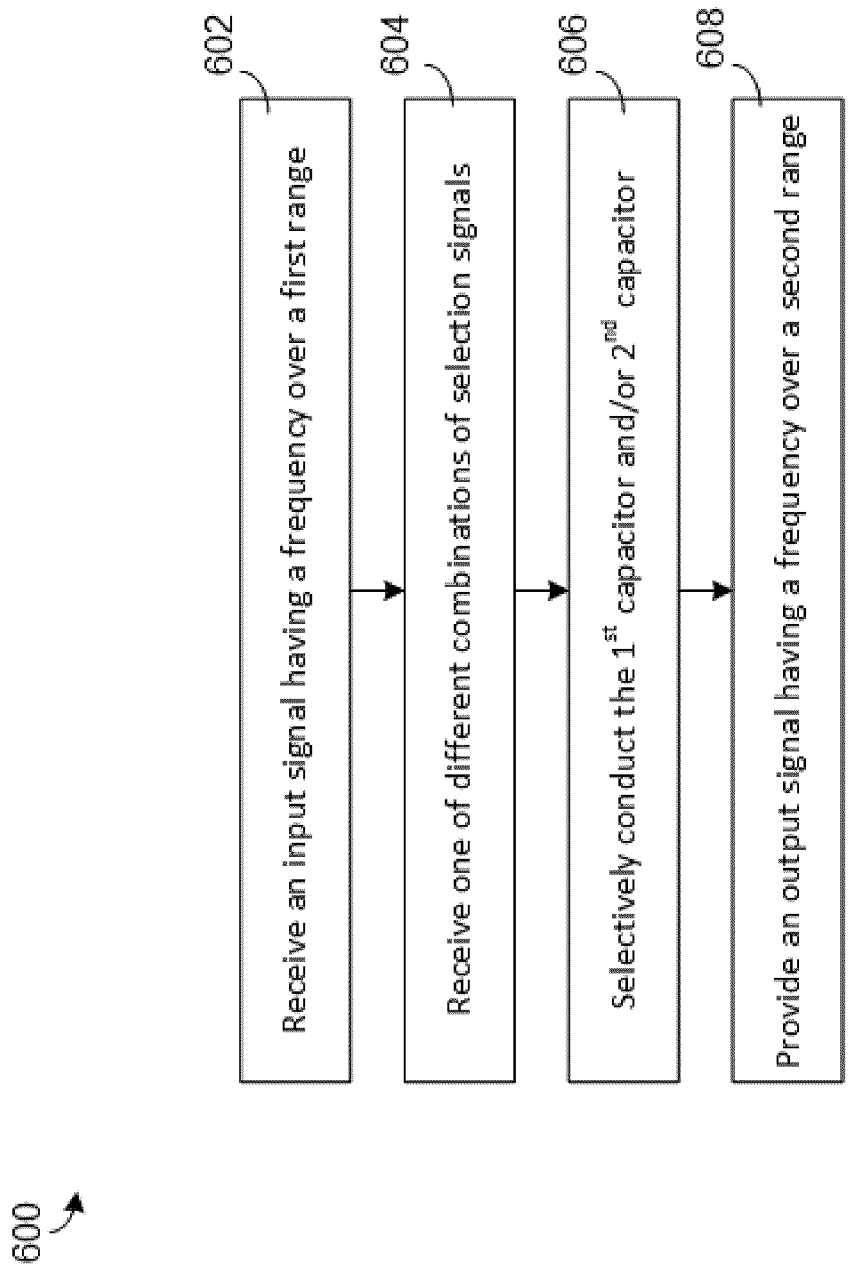
FIG. 6 is a flow chart of an example method to operate the sub-circuit of FIG. 4, according to an embodiment.

FIG. 6 illustrates a flow chart of an example method 600 to operate the sub-circuit 400, in accordance with various embodiments. In various embodiments, the operations of the method 600 are performed by the respective components illustrated in FIGS. 1-2 and 4. For purposes of discussion, the following embodiment of the method 600 will be described in conjunction with FIGS. 1-3. The illustrated embodiment of the method 600 is merely an example. Therefore, it should be understood that any of a variety of operations may be omitted, re-sequenced, and/or added while remaining within the scope of the present disclosure.

In some embodiments, the method 600 starts with operation 602 in which the sub-circuit 400 receives an input signal (e.g., 411) having a frequency extending across a first frequency range. The sub-circuit 400 may receive the input signal 411 at node A of the example circuit diagram of FIG. 4.

Prior to, simultaneously with, or subsequently to receiving the input signal 411, the sub-circuit 400 may receive one of different combinations of a pair of selection signals (e.g., 415 and 417) (operation 604), in accordance with some embodiments. For example, such combinations of the selection signals 415 and 417 may include at least one of the following: (logical 1, logical 1), (logical 1, logical 0), (logical 0, logical 1), and (logical 0, logical 0). In some embodiments, a control node (e.g., a gate) of the controllable switch 408 and a control node (e.g., a gate) of the controllable switch 410 are structured to receive the selection signals 415 and 417 at node C and node D, respectively.

Next, the method 600 proceeds to operation 606 in which the capacitors 408 and 410 are selectively activated. In some embodiments, in response to the selection signal 415 presenting logical 1 and the selection signal 417 presenting logical 1, the controllable switches 408 and 410 (when each implemented as an n-type MOSFET) are activated or turned on, which conducts both of the capacitors 404 and 406; in response to the selection signal 415 presenting logical 1 and the selection signal 417 presenting logical 0, the controllable switch 410 (when implemented as an n-type MOSFET) is de-activated or turned off, which isolates the capacitor 406 from conducting current while the capacitor 404 conducts current; and in response to the selection signal 415 presenting logical 0 and the selection signal 417 presenting logical 1, the controllable switch 409 (when implemented as an n-type MOSFET) is de-activated or turned off, which isolates the capacitor 404 from conducting current while the capacitor 406 conducts current. As discussed above, when the capacitors 404 and 406 both conduct current, the resistor 402, together with both of the capacitors 404 and 406 that are connected in parallel, can form a first low-pass filter with cut-off frequency f3; when only the capacitor 404 conducts current, the resistor 302, together with only the capacitor 404, can form a second low-pass filter with cut-off frequency f4; and when only the capacitor 406 conducts current, the resistor 302, together with only the capacitor 406, can form a third low-pass filter with cut-off frequency f5.

The method 600 proceeds to operation 608 in which the sub-circuit 400 provides an output signal (e.g., 413) having a frequency extending across a second frequency range. In some embodiments, the second frequency range occupies a lower portion of the first frequency range of the input signal 411. Continuing with the above example, when the first low-pass filter is formed (both of the capacitors 404 and 406 conduct current), a portion of the input signal 411 is allowed to pass through the first low-pass filter to form the output signal 413. Specifically, the allowed portion of the input signal 411 (i.e., the output signal 413) presents a second frequency range occupying a portion of the first frequency range that is lower than f3. Similarly, when the second low-pass filter is formed (only the capacitor 404 conducts current), the second frequency range of the output signal 413 occupies a portion of the first frequency range that is lower than f4, and when the second low-pass filter is formed (only the capacitor 406 conducts current), the second frequency range of the output signal 413 occupies a portion of the first frequency range that is lower than f5.

Figure 7:
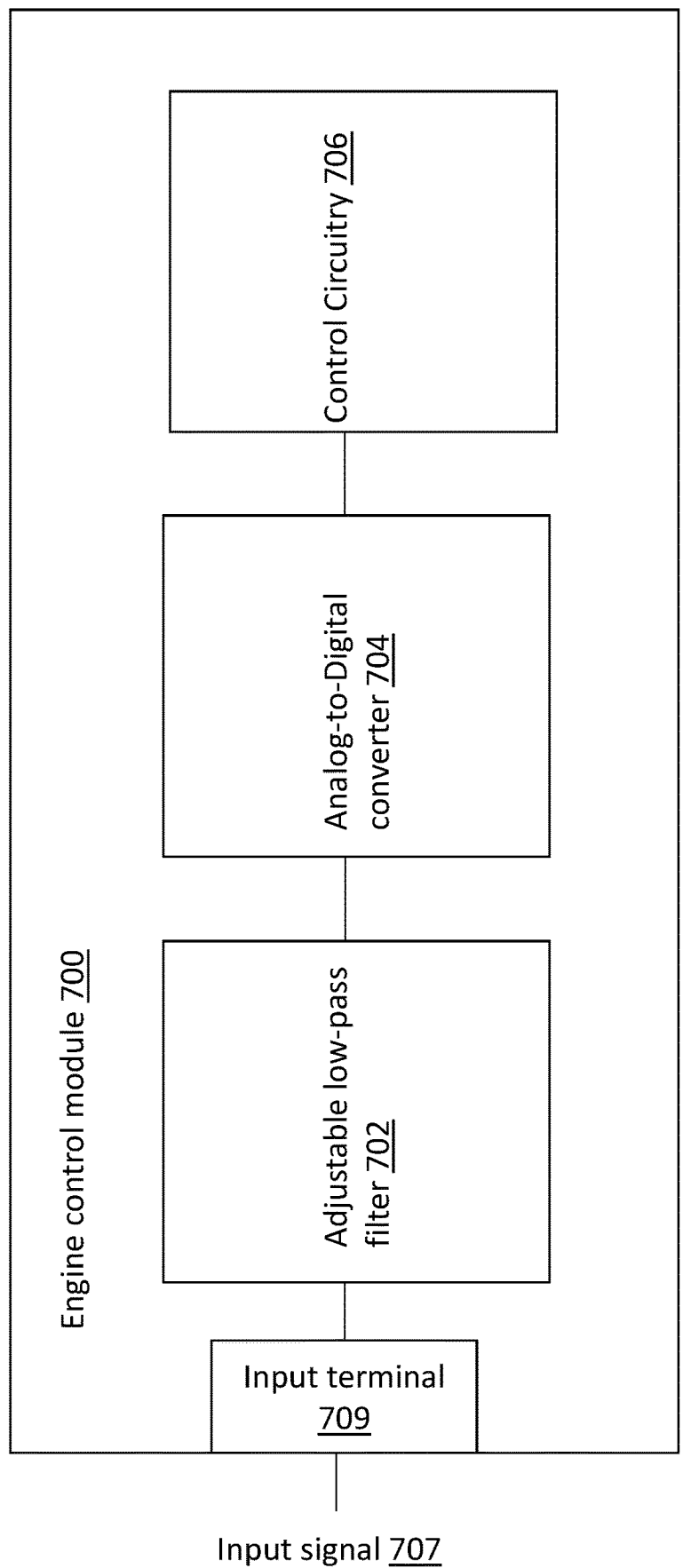
FIG. 7 is an illustrative block diagram of an engine control module, according to an embodiment.

Referring to FIG. 7, an illustrative block diagram of an engine control module 700, which may be implemented as a part of the vehicle controller 150 (FIGS. 1 and 2), is provided. As shown, the engine control module 700 can include an adjustable low-pass filter 702, an analog-to-digital converter 704, and control circuitry 706 (one or more of the remaining circuits 155-158 in FIG. 2). In some embodiments, the engine control module 700 is configured to receive an input signal 707 from an input terminal 709. The adjustable low-pass filter 702 is coupled between the input terminal 709 and the analog-to-digital converter 704 such that the analog-to-digital converter 704 receives the input signal 707 from the input terminal 707 via the adjustable low-pass filter 702. The analog-to-digital converter 704 is coupled between the adjustable low-pass filter 702 and the control circuitry 706 such that the control circuitry may receive the input signal 707 from the analog-to-digital converter 704 and to control at least one engine setting or output (e.g., a setting of the engine 101, a setting of the transmission 102, etc.) based on the input signal 707.

In some embodiments, the adjustable low-pass filter 702 is configured to filter the input signal 707 from the input terminal 709 prior to the input signal 707 being applied to the analog-to-digital converter 704. The adjustable low-pass filter 702 can have a number of settings, each of which can provide a respective cut-off frequency. For example, when the adjustable low-pass filter 702 is configured in a first setting, the adjustable low-pass filter 702 can have a first cut-off frequency; and when the adjustable low-pass filter 702 is configured in a second setting, the adjustable low-pass filter 702 can have a second cutoff frequency. The first setting configures the electronic control module 700 to be used with a first sensor having a first dynamic range and the second setting configures the electronic control module 700 to be used with a second sensor having a second dynamic range. The adjustable low-pass filter 702 may receive the input signal 707 from either the first sensor or the second sensor via the input terminal 709.

In some embodiments, the adjustable low-pass filter 702 may include the sub-circuits 300 and/or 400, as illustrated in FIGS. 3 and 4, respectively. Accordingly, the engine control module 700 can cause the adjustable low-pass filter 702 to be in one of a number of settings, via one or more section signals (e.g., selection signal 317, or a combination of selection signals 415 and 417), to provide a respective different cut-off frequency. In the case where the adjustable low-pass filter 702 includes the sub-circuit 300, the engine control module 700 may cause the sub-circuit 300 to be in a first setting, for example, pulling up the selection signal 317, to provide a first cut-off frequency; and a second setting, for example, pulling down the selection signal 317, to provide a second, different cut-off frequency. In the case where the adjustable low-pass filter 702 includes the sub-circuit 400, the engine control module 700 may cause the sub-circuit 400 to be in a first setting, for example, pulling up the selection signal 415 and pulling down the selection signal 417, to provide a first cut-off frequency; a second setting, for example, pulling up the selection signal 415 and pulling up the selection signal 417, to provide a second, different cut-off frequency; and a third setting, for example, pulling down the selection signal 415 and pulling up the selection signal 417, to provide a third, different cut-off frequency.

As mentioned above and in one configuration, the "circuits" may be implemented in machine-readable medium for execution by various types of processors, such as the processor 152. An identified circuit of executable code may, for instance, comprise one or more physical or logical blocks of computer instructions, which may, for instance, be organized as an object, procedure, or function. Nevertheless, the executables of an identified circuit need not be physically located together, but may comprise disparate instructions stored in different locations which, when joined logically together, comprise the circuit and achieve the stated purpose for the circuit. Indeed, a circuit of computer readable program code may be a single instruction, or many instructions, and may even be distributed over several different code segments, among different programs, and across several memory devices. Similarly, operational data may be identified and illustrated herein within circuits, and may be embodied in any suitable form and organized within any suitable type of data structure. The operational data may be collected as a single data set, or may be distributed over different locations including over different storage devices, and may exist, at least partially, merely as electronic signals on a system or network.

While the term "processor" is briefly defined above, it should be understood that the term "processor" and "processing circuit" are meant to be broadly interpreted. In this regard and as mentioned above, the "processor" may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor, etc.), microprocessor, etc. In some embodiments, the one or more processors may be external to the apparatus, for example the one or more processors may be a remote processor (e.g., a cloud based processor). Alternatively or additionally, the one or more processors may be internal and/or local to the apparatus. In this regard, a given circuit or components thereof may be disposed locally (e.g., as part of a local server, a local computing system, etc.) or remotely (e.g., as part of a remote server such as a cloud based server). To that end, a "circuit" as described herein may include components that are distributed across one or more locations.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure as defined in the appended claims. Such variations will depend on the machine-readable media and hardware systems chosen and on designer choice. It is understood that all such variations are within the scope of the disclosure.

The foregoing description of embodiments has been presented for purposes of illustration and description. It is not intended to be exhaustive or to limit the disclosure to the precise form disclosed, and modifications and variations are possible in light of the above teachings or may be acquired from this disclosure. The embodiments were chosen and described in order to explain the principals of the disclosure and its practical application to enable one skilled in the art to utilize the various embodiments and with various modifications as are suited to the particular use contemplated. Other substitutions, modifications, changes and omissions may be made in the design, operating conditions and arrangement of the embodiments without departing from the scope of the present disclosure as expressed in the appended claims.

What is claimed is:

1. An engine control module comprising:
   an input terminal configured to receive an input signal;
   an analog-to-digital converter configured to receive the input signal from the input terminal;
   control circuitry configured to receive the input signal from the analog-to-digital converter and to control at least one engine output based on the input signal; and
   an adjustable low-pass filter, the adjustable low-pass filter being coupled between the input terminal and the analog-to-digital converter such that the analog-to-digital converter receives the input signal from the input terminal via the adjustable low-pass filter, the adjustable low-pass filter being configured to filter the input signal from the input terminal prior to the input signal being applied to the analog-to-digital converter, the adjustable low-pass filter having a first setting in which the adjustable low-pass filter has a first cut-off frequency and a second setting in which the adjustable low-pass filter has a second cut-off frequency, wherein the first setting configures the engine control module to be used with a first sensor having a first dynamic range and the second setting configures the engine control module to be used with a second sensor having a second dynamic range.

2. The engine control module of claim 1, wherein the input signal is received from the first sensor or the second sensor via the input terminal.

3. The engine control module of claim 1, wherein the adjustable low-pass filter comprises:
   a resistor;
   a first capacitor coupled to one end of the resistor;
   a second capacitor coupled to the one end of the resistor; and
   a first controllable switch coupled to the first capacitor,
   wherein the first controllable switch is selectively turned on to conduct the first capacitor to cause the adjustable low-pass filter to provide either the first cut-off frequency or the second cut-off frequency.

4. The engine control module of claim 3, wherein a capacitance value of the first capacitor is greater than a capacitance value of the second capacitor.

5. The engine control module of claim 3, wherein the adjustable low-pass filter further comprises:
   a second controllable switch coupled to the second capacitor, the second controllable switch being selectively turned on to conduct the second capacitor.

6. The engine control module of claim 5, wherein the adjustable low-pass filter is configured to:
   when the first and second capacitors conduct current, present the first cut-off frequency;
   when only the first capacitor conducts current, present the second cut-off frequency; or
   when only the second capacitor conducts current, present the third cut-off frequency.

7. The engine control module of claim 6, wherein the first cut-off frequency is less than the second and third cut-off frequencies.

8. A method of processing control signals of different frequency ranges in a vehicle, the method comprising:
   providing an engine control module having an input terminal configured to receive an input signal, an analog-to-digital converter configured to receive the input signal from the input terminal, control circuitry configured to receive the input signal from the analog-to-digital converter and to control at least one engine output based on the input signal, and an adjustable low-pass filter;
   coupling the adjustable low-pass filter between the input terminal and the analog-to-digital converter such that the analog-to-digital converter receives the input signal from the input terminal via the adjustable low-pass filter;
   configuring a first setting of the adjustable low-pass filter such that the adjustable low-pass filter has a first cut-off frequency and configuring a second setting such that the adjustable low-pass filter has a second cut-off frequency, wherein the first setting configures the engine control module to be used with a first sensor having a first dynamic range and the second setting configures the engine control module to be used with a second sensor having a second dynamic range; and
   causing the adjustable low-pass filter to filter the input signal from the input terminal prior to the input signal being applied to the analog-to-digital converter.

9. The method of claim 7, further comprising receiving the input signal from the first sensor or the second sensor via the input terminal.

10. The method of claim 7, wherein the adjustable low-pass filter comprises:
a resistor;
a first capacitor coupled to one end of the resistor;
a second capacitor coupled to the one end of the resistor; and
a first controllable switch coupled to the first capacitor,
the method further comprising selectively turning on the first controllable switch to conduct the first capacitor such that the adjustable low-pass filter provides either the first cut-off frequency or the second cut-off frequency.

11. The method of claim 10, wherein a capacitance value of the first capacitor is greater than a capacitance value of the second capacitor.

12. The method claim 10, wherein the adjustable low-pass filter further comprises a second controllable switch coupled to the second capacitor, the method further comprising selectively turning on the second controllable switch to conduct the second capacitor.

13. The method of claim 12, further comprising configuring the adjustable low-pass filter to:
when the first and second capacitors conduct current, present the first cut-off frequency;
when only the first capacitor conducts current, present the second cut-off frequency; or
when only the second capacitor conducts current, present the third cut-off frequency.

14. The method of claim 13, wherein the first cut-off frequency is less than the second and third cut-off frequencies.

15. A computer-readable medium containing computer-executable instructions stored thereon, the instructions, when executed by at least one processor of an engine control module, cause the engine control module to perform operations to process control signals of different frequency ranges, the instructions comprising:
configuring a first setting of an adjustable low-pass filter such that the adjustable low-pass filter has a first cut-off frequency and configuring a second setting of the adjustable low-pass filter such that the adjustable low-pass filter has a second cut-off frequency, wherein the first setting configures the engine control module to be used with a first sensor having a first dynamic range and the second setting configures the engine control module to be used with a second sensor having a second dynamic range;
receiving an input signal from the first sensor or the second sensor via an input terminal;
causing the adjustable low-pass filter to filter the input signal from the input terminal; and
causing the adjustable low-pass filter to apply the input signal to an analog-to-digital converter such that at least one engine output is controlled based on the input signal;
wherein the adjustable low-pass filter is coupled between the input terminal and the analog-to-digital converter such that the analog-to-digital converter receives the input signal from the input terminal via the adjustable low-pass filter.

16. The computer-readable medium of claim 15, wherein the adjustable low-pass filter comprises:
a resistor;
a first capacitor coupled to one end of the resistor;
a second capacitor coupled to the one end of the resistor; and
a first controllable switch coupled to the first capacitor,
the instructions further comprising selectively turning on the first controllable switch to conduct the first capacitor such that the adjustable low-pass filter provides either the first cut-off frequency or the second cut-off frequency.

17. The computer-readable medium of claim 16, wherein a capacitance value of the first capacitor is greater than a capacitance value of the second capacitor.

18. The computer-readable medium of claim 16, wherein the adjustable low-pass filter further comprises a second controllable switch coupled to the second capacitor, the instructions further comprising selectively turning on the second controllable switch to conduct the second capacitor.

19. The computer-readable medium of claim 18, the instructions further comprising operations to:
when the first and second capacitors conduct current, present the first cut-off frequency;
when only the first capacitor conducts current, present the second cut-off frequency; or
when only the second capacitor conducts current, present the third cut-off frequency.

20. The computer-readable medium of claim 19, wherein the first cut-off frequency is less than the second and third cut-off frequencies.

* * * * *